(12) United States Patent
Schnier

(10) Patent No.: US 9,678,436 B2
(45) Date of Patent: Jun. 13, 2017

(54) IRRADIATION MODULE FOR A MEASURING APPARATUS

(71) Applicant: Carl Zeiss SMT GmbH, Oberkochen (DE)

(72) Inventor: Dietmar Schnier, Garbsen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 945 days.

(21) Appl. No.: 13/872,356

(22) Filed: Apr. 29, 2013

(65) Prior Publication Data

US 2013/0293962 A1 Nov. 7, 2013

Related U.S. Application Data

(60) Provisional application No. 61/642,548, filed on May 4, 2012.

(30) Foreign Application Priority Data

May 4, 2012 (DE) .......................... 10 2012 008 745

(51) Int. Cl.
*G02B 5/18* (2006.01)
*G03F 1/84* (2012.01)
*G03F 7/20* (2006.01)

(52) U.S. Cl.
CPC ....... *G03F 7/70133* (2013.01); *G02B 5/1861* (2013.01); *G03F 1/84* (2013.01); *G03F 7/70775* (2013.01)

(58) Field of Classification Search
CPC .... G02B 5/04; G02B 5/1814; G02B 27/4233; G02B 6/29349; G03F 7/70133; G03F 7/70775

USPC ....... 359/618, 628, 636, 637, 639, 640, 831, 359/850; 356/486, 498

See application file for complete search history.

(56) References Cited

U.S. PATENT DOCUMENTS

| 7,050,171 | B1 | 5/2006 | Banerjee et al. |
| 2002/0145738 | A1* | 10/2002 | Lex ............... G01B 9/02019 356/498 |
| 2005/0094155 | A1* | 5/2005 | Hill ............... G03F 7/70775 356/500 |
| 2006/0077396 | A1* | 4/2006 | Park .............. G03F 7/70775 356/500 |

(Continued)

FOREIGN PATENT DOCUMENTS

DE 10 2006 037 529 7/2007 ............. G01B 9/02

OTHER PUBLICATIONS

Office Action of German priority application, Application No. 10 2012 008 745.4, issued by Dr. Reiner Urschel, dated Jan. 9, 2013 along with an English translation of the office action.

(Continued)

*Primary Examiner* — Kimberly N Kakalec
(74) *Attorney, Agent, or Firm* — Fish & Richardson P.C.

(57) ABSTRACT

An irradiation module for a measuring apparatus is provided. The irradiation module is light-conductive, is configured as a cohesive body and comprises a beam-splitting surface arranged within the irradiation module for splitting an incoming measuring beam into two partial beams. Furthermore, the irradiation module comprises an optical diffraction grating for interaction with a first of the two partial beams and a reflection surface for reflecting the second partial beam.

40 Claims, 6 Drawing Sheets

(56) References Cited

U.S. PATENT DOCUMENTS

2007/0146722 A1    6/2007    Trutna, Jr. et al.
2008/0198388 A1    8/2008    Kranz et al.

OTHER PUBLICATIONS

Peter L. M. Heydemann, "Determination and correction of quadrature fringe measurement errors in interferometers," *Applied Optics*, vol. 20, No. 19, pp. 3382 to 3384 (Oct. 1, 1981).

Stacy Wise et. al., "Phase Effects in the Diffraction of Light: Beyond the Grating Equation," *Physical Review Letters*, PRL 95, pp. 013901-1 to 013901-4 (week ending Jul. 1, 2005).

\* cited by examiner

State of the art

IRRADIATION MODULE FOR A MEASURING APPARATUS

CROSS REFERENCE TO RELATED APPLICATIONS

This application claims priority to the German Patent Application No. 10 2012 008 745.4, filed on May 4, 2012, and the U.S. Provisional Application No. 61/642,548, filed on May 4, 2012. The entire disclosure of the German patent application and the U.S. Provisional Application are incorporated into the present application by reference.

BACKGROUND TO THE INVENTION

The invention relates to an irradiation module for a measuring apparatus which is configured to measure a position change of a measuring object in at least one spatial direction in relation to a reference object by irradiating the irradiation module with measuring light. Furthermore, the invention relates to a measuring apparatus comprising this type of irradiation module and to a mask inspection tool and a projection exposure tool for microlithography, respectively comprising this type of measuring apparatus.

Michelson interferometers are often used to measure position changes of a measuring object with respect to a reference object. An example of this type of Michelson interferometer known from the prior art in the embodiment as a homodyne laser interferometer is shown in FIG. 12. A monochromatic frequency-stabilised laser 612 is used as the light source here. Typically, there is fastened to the measuring object a mirror, in this case in the form of a reflection prism 620, the movement of which with respect to a fixed polarising beam splitter 616 and a fixed reference mirror, in the present case in the form of a further reflection prism, is determined.

In comparison with the use of simple end mirrors as reflectors and the use of a non-polarising beam splitter, the advantage of using the reflection prism and the polarising beam splitter is that the effect of cyclical errors, e.g., power fluctuations and the effects of tilts in the reflectors, can be reduced, as described, e.g., in the document by P. L. M. Heydemann, "Determination and correction of quadrature fringe measurement errors in interferometers," Applied Optics, Vol. 20, No. 19, October 1981, pages 3382-3384.

A further improvement of the measuring results can be achieved by means of the so-called heterodyne measuring principle wherein the output beam of the laser consists of two components with different polarisation directions and slightly different frequencies. This enables particularly elegant measurement of the displacement of the measuring reflector. A phase difference between the measuring and the reference signal, which is proportional to the displacement of the measuring reflector, is produced.

All of these set-ups are associated with the basic problem that the optical path lengths in the interferometer arms not only differ due to the movement of the optical components, but also due to changes in the refraction index of the air. In principle, refraction index fluctuations can be measured with high resolution. In practice, however, it is only possible with difficulty to take these measurements at the precise position of the optical beams within the interferometer. This would be necessary, however, for a precise correction of the measuring deviations which occur.

Underlying Object

It is an object of the invention to provide an irradiation module and a measuring apparatus of the type specified at the start by means of which the aforementioned problems are resolved, and in particular a highly accurate position measurement, the accuracy of which is not affected by refraction index fluctuations in the air, is made possible.

Solution According to the Invention

The aforementioned object can be achieved according to the invention with an irradiation module for a measuring apparatus. The measuring apparatus is configured in particular to measure a position change of a measuring object in at least one spatial direction in relation to a reference object by irradiating the irradiation module with measuring light. The irradiation module according to the invention is light-conductive and is configured as a cohesive body. Furthermore, the irradiation module comprises a beam-splitting surface arranged within the irradiation module for splitting an incoming measuring beam into two partial beams, an optical diffraction grating for interaction with a first of the two partial beams, and a reflection surface for reflecting the second partial beam.

In other words, an irradiation module for a measuring apparatus is provided, the measuring apparatus generating measuring light with which the irradiation module is irradiated during measuring operation. The irradiation module is configured as a cohesive body and is light-conductive as regards the measuring light. In accordance with the application, this type of cohesive body can comprise, for example, a number of partial bodies which are in contact with one another along respective side surfaces. Furthermore, a cohesive body can also be formed from a standard work piece.

Located within the irradiation module is a beam-splitting surface for splitting the incoming measuring beam into two partial beams. Furthermore, the irradiation module comprises a diffraction grating for interaction with a first of the two partial beams. This type of diffraction grating can be disposed, for example, on an outer surface of the irradiation module and be configured to throw the first partial beam, reflected in an order of diffraction, back onto the beam-splitting surface. The optical diffraction grating can be configured here such that the first partial beam is reflected in a direction that deviates from the law of reflection according to which the angle of incidence is equal to the angle of reflection. This type of optical diffraction grating, which serves to reflect the irradiated first partial beam back into itself, is also called a Littrow grating in professional circles. Furthermore, the irradiation module comprises at least one reflection surface for reflecting the second partial beam. This reflection surface can be formed, for example, by a side surface of the irradiation module provided with a reflection coating.

Due to the configuration of the irradiation module as a light-conductive cohesive body the beam path of the measuring radiation including the partial beams in the irradiation module can be configured such that the measuring light runs continuously within the irradiation module. Here the beam path can run continuously through solid, light-conductive material of the irradiation module. Alternatively, the beam path can also run partially through air chambers within the irradiation module which are totally surrounded by the irradiation module so that no or only insignificant diffraction index fluctuations can form in the air contained therein. Due to this configuration of the irradiation module the measuring radiation, as it enters into the irradiation module, no longer comes into contact with ambient air. Therefore the effect of refraction index fluctuations in the ambient air upon the position measurement is reduced to a minimum or is totally eliminated.

According to one embodiment according to the invention the irradiation module further comprises an irradiation surface for irradiation of the measuring beam. The irradiation module is configured here such that upon irradiating the measuring beam at a respectively appropriate angle of incidence onto the irradiation surface, the reflected partial beams are superimposed with one another independently of the position of the measuring beam on the irradiation surface. Furthermore, in the aforementioned embodiment according to the invention the irradiation module is configured such that the optical path length of the first partial beam between the beam-splitting surface and the diffraction grating is independent of the position of the measuring beam on the irradiation surface, i.e., the optical path length does not change due to a change in the position of the measuring beam on the irradiation surface. Furthermore, the optical path length of the second partial beam between the beam-splitting surface and the reflection surface is dependent upon the position of the measuring beam on the irradiation surface. It is assumed here that the angle of incidence of the measuring beam for the different positions on the irradiation surface is respectively chosen such that the reflected partial beams are superimposed with one another. According to one embodiment the angle of incidence of the measuring beam in relation to the irradiation surface is the same for the different positions of the measuring beam. Furthermore, in the aforementioned embodiment the irradiation module is configured such that the superimposed partial beams have a phase difference that is dependent upon the position of the measuring beam on the irradiation surface. According to certain embodiments the irradiation module is configured such that, in a cross sectional view, the beam-splitting surface is arranged parallel to the optical diffraction grating, i.e., a surface along which the optical diffraction grating extends, which cross sectional view in particular is along a cross sectional plane, which is perpendicular to the beam splitting surface and contains the direction of the incoming measuring beam.

As already indicated above, according to one embodiment according to the invention the irradiation module has a closed surface such that respective beam paths of the partial beams are totally enclosed by the surface of the irradiation module up to where the partial beams are brought together again in the irradiation module. Air chambers can be arranged within the closed surface, or alternatively the volume within the closed surface can also be made entirely of a solid material. The irradiation module can thus be configured as a solid body such that respective beam paths of the partial beams run continuously within solid material up to where the partial beams are brought together again in the irradiation module.

According to a further embodiment according to the invention the irradiation module comprises two partial bodies which are connected to one another along the beam-splitting surface. Thus, the two partial bodies can be connected to one another in particular by means of a beam-splitting layer. This type of beam-splitting layer can be, e.g., dielectric or metallic. An example of this type of embodiment is the configuration of the irradiation module as a beam splitter cube which has two cemented prisms which are connected to one another by means of a beam-splitting coating on the respective hypotenuse side of the prisms. According to one embodiment the beam-splitting surface is configured as a polarising beam splitter.

According to a further embodiment according to the invention one of the two partial bodies has a form tapering in a longitudinal direction of the beam-splitting surface and in particular is configured in the shape of a wedge.

According to a further embodiment according to the invention the irradiation module is configured as a retroreflector such that measuring light irradiated onto the irradiation module in an irradiating direction after interaction with the irradiation module is radiated in a radiating direction opposite to the irradiating direction independently of the precise alignment of the irradiation module. According to one version the measuring light is radiated in a direction opposite to the irradiating direction for as long as the alignment of the irradiation module with respect to the irradiating direction of the measuring light deviates from a target alignment by less than 1°, in particular by less than 0.2° or by less than 0.1°. Radiation in the opposite direction is understood to be radiation which deviates from the exactly opposite direction by less than 1°, in particular by less than 0.1° or by less than 0.05°.

As already mentioned above, according to a further embodiment according to the invention the optical diffraction grating is configured to reflect the first partial beam in a direction that deviates from a direction specified by the law of reflection. According to one version the optical diffraction grating with regard to the first partial beam is in the form of a Littrow grating. In this case the first partial beam is reflected into itself. According to a further version two optical diffraction gratings are arranged such that the first partial beam is directed by reflection on both diffraction gratings in a direction which is opposite to the irradiating direction. The irradiating direction of the first partial beam is preferably orientated perpendicularly to a surface of the irradiation module onto which the measuring beam is irradiated.

According to a further embodiment according to the invention the irradiation module has two diffraction gratings tilted towards one another. The latter are for example tilted towards one another such that the direction of the first partial beam is reversed by reflection on both diffraction gratings, and in particular is additionally offset in parallel.

According to a further embodiment according to the invention the irradiation module has two reflection surfaces tilted towards one another. The reflection surfaces can be tilted towards one another such that the direction of the second partial beam is reversed by reflection on both reflection surfaces, and in particular is additionally offset in parallel.

According to a further embodiment according to the invention the irradiation module has two pairs of reflection surfaces respectively tilted towards one another. Therefore the irradiation module can be used to measure a position change of the measuring object in two spatial directions.

Furthermore, according to the invention a measuring apparatus comprising an irradiation module is provided in one of the above embodiments. The measuring apparatus is configured to measure a position change of a measuring object in at least one spatial direction in relation to a reference object. Furthermore, the measuring apparatus has a beam generation device for generating the measuring beam, the beam generation device being arranged moveably in relation to the irradiation module. According to certain embodiments the beam generation device further comprises a detector, which is arranged in a fixed position with respect to the beam generation device, i.e., the detector is also arranged moveably in relation to the irradiation module.

According to one embodiment of the measuring apparatus according to the invention the beam generation device is configured to irradiate two measuring beams in different directions onto the irradiation module, and the irradiation module is configured to reflect back the measuring beams such that by measuring the reflected back measuring beams a position change of the irradiation module can be determined in two spatial directions.

According to a further embodiment according to the invention the measuring apparatus further comprises at least one back-reflection element which is configured to reflect a beam passing out of the irradiation module back onto the irradiation module such that the reflected back beam is offset with respect to the beam passing out of the irradiation module transversely to the beam direction. Advantageously the irradiation module is arranged moveably with respect to the back-reflection element. The back-reflection element can thus be fixed with respect to the beam generation device, the module comprising the back-reflection element and the beam generation device on the one hand and the irradiation module on the other hand being arranged moveably in relation to one another. According to one embodiment the measuring apparatus comprises two back-reflection elements of the aforementioned type which are aligned orthogonally to one another so that a position measurement can be taken in two spatial directions.

According to a further embodiment according to the invention the irradiation module is configured to bring the partial beams back together again after interaction with the optical diffraction grating or the reflection surface such that the beam brought together is offset in a first direction with respect to the measuring beam. Furthermore, the measuring apparatus comprises a back-reflection element which is configured to offset the beam brought together by back reflection in a direction which has at least one component orthogonal to the first direction.

According to a further embodiment according to the invention the back-reflection element is configured to further offset the brought together beam by the back reflection parallel to the first direction. Therefore, the beam originating from the back-reflection element strikes the irradiation module such that a partial beam originating from this beam strikes the optical grating at the same angle as the first partial beam of the measuring beam.

Furthermore, according to the invention a mask inspection tool for inspecting a lithography mask, which comprises a measuring apparatus in one of the embodiments described above, is provided. The mask inspection tool serves to identify write errors on the lithography mask and comprises imaging optics for imaging mask structures of the lithography mask onto a detector.

Furthermore, according to the invention a position determining tool for determining the positioning of structures on a lithography mask (also called "registration measuring device") which comprises a measuring apparatus in one of the embodiments according to the invention described above is provided.

According to one embodiment of the mask inspection tool or the position determining tool the latter comprises a mask holder that is mounted moveably with respect to a reference frame. The measuring apparatus is configured to measure a position change of the mask holder in relation to the reference frame. For this purpose, e.g., the beam generation device can be arranged on the reference frame and the irradiation module on the mask holder.

Furthermore, according to the invention a projection exposure tool for microlithography, which contains a measuring apparatus in one of the embodiments described above, is provided. This type of projection exposure tool comprises a projection objective for imaging mask structures of a lithography mask onto a substrate.

According to one embodiment the projection exposure tool according to the invention has a first holding apparatus for holding a lithography mask and a second holding apparatus for holding a substrate to be structured. The holding apparatuses are respectively mounted moveably with respect to a reference frame, and the measuring apparatus is configured to measure a position change of one of the two holding apparatuses in relation to the reference frame.

The features of the embodiments according to the invention described above are explained in the claims and in the description of the figures. The individual features can either be realised separately or in combination as embodiments of the invention. Furthermore, they can describe advantageous embodiments which are capable of being protected independently and the protection of which, if so required, is only claimed during or after pendency of the application.

BRIEF DESCRIPTION OF THE DRAWINGS

The above features and further advantageous features of the invention are illustrated in the following detailed description of exemplary embodiments according to the invention with reference to the attached diagrammatic drawings. These show as follows.

DETAILED DESCRIPTION OF EXEMPLARY EMBODIMENTS ACCORDING TO THE INVENTION

In the exemplary embodiments and embodiments described below, elements which are similar to one another functionally or structurally are provided as far as possible with the same or similar reference numbers. Therefore, in order to understand the features of the individual elements of a specific exemplary embodiment, reference should be made to the description of other exemplary embodiments or to the general description of the invention.

Figure 1:
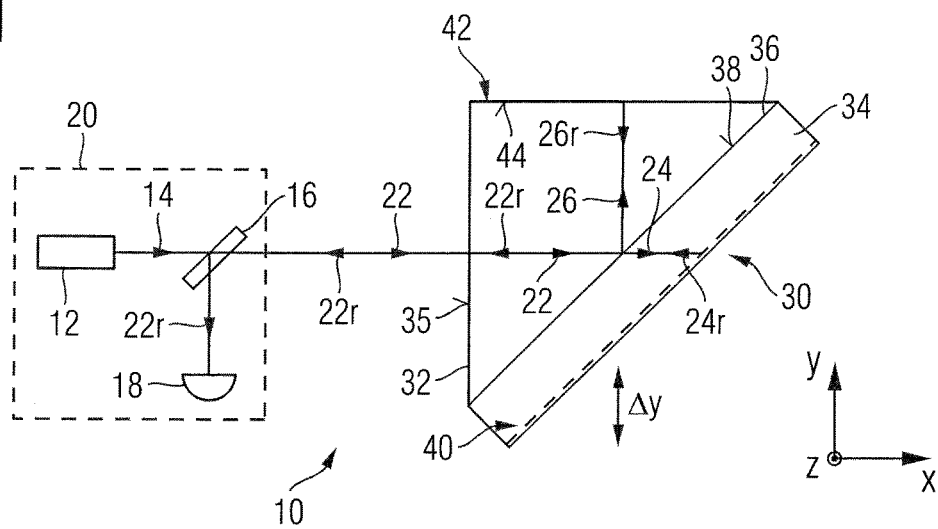
FIG. 1 a diagrammatic side view of an embodiment according to the invention of a measuring apparatus for measuring a position change of a measuring object, the measuring apparatus comprising a measuring head and an irradiation module, which is irradiated from the measuring head with measuring radiation, in an embodiment according to the invention, FIG. 2 an illustration of the beam path of the measuring radiation in the irradiation module from FIG. 1, FIG. 3 an illustration of the measuring beam path in the irradiation module when the position of the irradiation module is displaced in the y direction with respect to the position from FIG. 2, FIG. 4 an illustration of the measuring beam path in the irradiation module when the position of the irradiation module is displaced in the x direction with respect to the position from FIG. 2, FIG. 5 a perspective view of a further embodiment according to the invention of the irradiation module together with a back-reflection element in the form of a deflection prism, FIG. 6 a top view of the irradiation module from FIG. 5 together with a beam generation device and a detector, FIG. 7 a perspective view of the irradiation module from FIG. 5 together with a further embodiment of the back-reflection element, FIG. 8 the irradiation module and the back-reflection element from FIG. 7 with a changed viewing angle, FIG. 9 the irradiation module from FIG. 8 in an embodiment modified to radiate from two directions together with two back-reflection elements, FIG. 10 a mask inspection tool for the inspection of a lithography mask with a measuring apparatus according to the invention integrated into the latter, FIG. 11 a projection exposure tool for microlithography with measuring apparatuses according to the invention integrated into the latter, and FIG. 12 an illustration of a homodyne laser interferometer known from the prior art.

In order to facilitate the description of the projection exposure tool a Cartesian xyz coordinate system is specified in the drawing from which the respective relative position of the components shown in the figures emerges. In FIG. 1, the z direction runs perpendicularly to the plane of the drawing from the latter, the x direction runs to the right, and the y direction upwards.

FIG. 1 illustrates an embodiment according to the invention of a measuring apparatus 10 for measuring a position change of a measuring object in relation to a reference object. The measuring apparatus 10 comprises a measuring head 20 for generating a measuring beam 22 and an irradiation module 30 which is irradiated by the measuring beam 22 during measuring operation. For this purpose the measuring head 20 can be fastened to a fixed reference object while the irradiation module 30 is fastened to a measuring object that can move relative to the reference object. Examples of use of the measuring apparatus 10 include a mask inspection tool 500 according to FIG. 10, a position determining tool and a projection exposure tool 550 for microlithography according to FIG. 11, as described in more detail below.

The measuring apparatus 10 according to FIG. 1 is configured to measure a position change of the irradiation module 30 transversely to the irradiating direction of the measuring beam 22, i.e., in the coordinate system according to FIG. 1 in the y direction. Specifically, the measuring head 20 comprises a beam generation device 12 for generating measuring light 14. The beam generation device 12 can, for example, comprise a helium-neon laser. In this case the wavelength of the measuring light 14 is approximately 633 nm and so within the visible wavelength range. Other wavelengths in the visible wavelength range or also wavelengths in the UV wavelength range or in the infrared wavelength range are also conceivable.

The measuring light 14 passes through a beam splitter 16, which is contained furthermore within the measuring head 20, and then passes out of the measuring head 20 as a measuring beam 22. The measuring beam 22 is irradiated onto the irradiation module 30 during measuring operation. The irradiation module 30 comprises a first partial body 32 in the form of a triangular prism and a second partial body 34 in the form of a cuboid. Both the first partial body and the second partial body are translucent to the measuring light 14, for example they can be produced from glass.

In the present case the base area of the prism forming the basis of the shape of the first partial body 32 is made as a right-angled triangle. The second partial body 34 is fastened by means of a beam-splitting layer 36 to the hypotenuse-side lateral face of the prism of the first partial body 32. The beam-splitting layer 36 can be dielectric or metallic and forms a beam-splitting surface 38 within the irradiation module 30. The measuring beam 22 irradiated onto the irradiation module 30 passes into the first partial body 32 and is split on the beam-splitting layer 36. The radiation passing through the beam-splitting layer 36 forms a first partial beam 24 while the radiation reflected on the beam-splitting layer 36 forms a second partial beam 26.

The first partial beam 24 passes through the cuboid-shaped second partial body 34 and strikes an optical diffraction grating 40 at an angle. The optical diffraction grating 40 is arranged on the lateral face of the cuboid-shaped second partial body 34 which lies opposite the lateral face resting against the beam-splitting layer 36. The beam-splitting surface 38 therefore extends in the cross sectional view shown in FIG. 1 parallel to the surface, along which the optical diffraction grating 40 extends. The cross sectional view shown in FIG. 1 employs a cross sectional plane which is perpendicular to the beam splitting surface 38 and contains the direction of the incoming measuring beam 22. The optical diffraction grating 40 is embodied as a so-called Littrow grating and is adapted to the wavelength of the measuring beam 22 and to the angle of incidence of the first partial beam such that the radiation of the first partial beam 24 is reflected back into itself. The radiation reflected back into itself is called a first partial beam reflected back into itself 24r.

As mentioned above, the first partial body 32 is embodied in the form of a triangular prism. The first cathetus-side lateral face of the prism serves as the irradiation surface 35 for the irradiation of the incoming measuring beam 22. The second cathetus-side lateral face serves as the reflection surface 44 for the second partial beam 26 and for this purpose is provided with a reflection coating 42. The light of the second partial beam 26 strikes the reflection surface 44 substantially perpendicularly and after reflection has taken place passes back as a reflected second partial beam 26r to the beam-splitting layer 36. The partial beam 26r is reflected on the beam-splitting layer 36 and then passes back together with the first partial beam 24r reflected back into itself as a measuring beam 22r passing back to the measuring head 20.

The optical path length of the first partial beam 24 between the beam-splitting surface 38 and the diffraction grating 40 is independent of the position of the measuring beam 22 on the irradiation surface while the optical path length of the second partial beam 26 between the beam-splitting surface and the reflection surface is dependent upon the position of the measuring beam on the irradiation surface. It is respectively assumed here that the measuring beam 22 strikes the irradiation surface perpendicularly.

In the measuring head 20, the measuring beam 22r passing back is reflected at the beam splitter 16 and is reflected onto a detector 18. The detector 18 is arranged in a fixed position within the measuring head 20, and therefore in relation to the beam splitter 16 and the beam generation device 12. The intensity measured by the detector 18 is the result of interference between the partial beams 24r and 26r. If the irradiation module 30 is displaced in the y direction the difference between the path length covered by the partial beams 24 and 24r and the path length covered by the partial beams 26 and 26r differs. In other words, the superimposed partial beams 24r and 26r have a phase difference that is dependent upon the position of the measuring beam 22 on the irradiation surface 25. The displacement of the irradiation module 30 leads to a variation of the intensity registered by the detector 18, as explained in more detail below with reference to FIGS. 2 to 4. A position change of the irradiation module 30 in relation to the measuring head 20 in the y direction is determined from the chronological progression of the intensity signal recorded by the detector 18.

Figure 2:
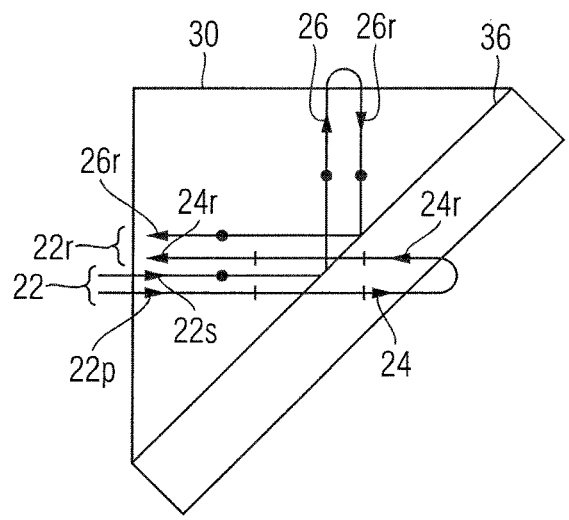
Figure 12:
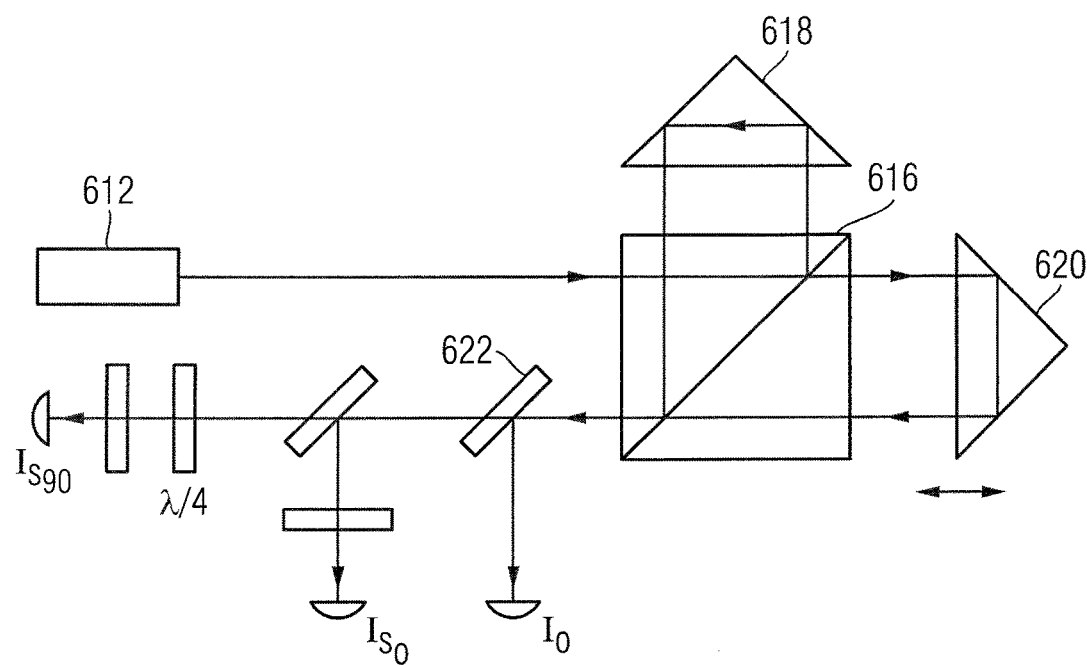

FIG. 2 shows the beam path of the measuring beam 22 in the irradiation module 30 of FIG. 1 by illustrating the individual polarisation components. For purposes of illustration the incoming measuring beam 22 is split into a portion 22s polarised perpendicularly to the plane of the drawing and a portion 22p polarised parallel to the plane of the drawing. The beam-splitting layer 36 acts as a polarising beam splitter by means of which the first partial beam 24 passing through the beam splitting layer 36 is polarised in parallel and the second partial beam 26 reflected on the beam-splitting layer 36 is polarised perpendicularly. In order to reduce the effect of cyclical errors, e.g., power fluctuations and tilts of the irradiation module 30, the individual polarisation components of the measuring beam 224 can also be analysed in addition to the recording of the measuring beam 22r passing back by means of the detector 18 according to FIG. 1. If the intensities of the individual polarisation portions deviate from the anticipated values, a corresponding correction takes place in the measuring result. For this purpose, similarly to the arrangement according to FIG. 12, the measuring head 20 can be equipped with corresponding λ/4 plates, polarisers and additional detectors. Furthermore, the measurement of the irradiation module can also be taken by means of the heterodyne measuring method known to the person skilled in the art. As already mentioned in the introduction to the description, in this method the irradiated measuring radiation contains different polarisation directions with slightly different optical frequencies.

Figure 3:
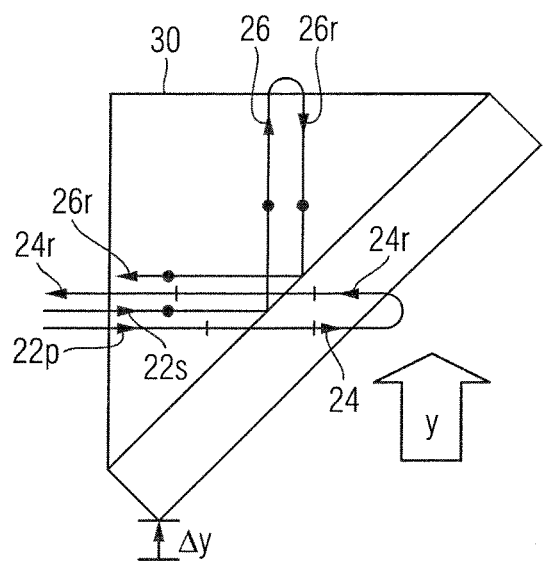

FIG. 3 shows the irradiation module 30 in a position displaced upwards, i.e. in the y direction with respect to the position from FIG. 2 and so transversely to the irradiating direction of the measuring beam 22. As is clear from FIG. 3, the optical path length for the second partial beam 26 or 26r is changed by this displacement while the path length for the first partial beam 24 or 24r remains the same. The superimposition of the reflected partial beams 24r and 26r on the detector 18 leads to a variation in the intensity of the measuring signal due to the changed path length.

Figure 4:
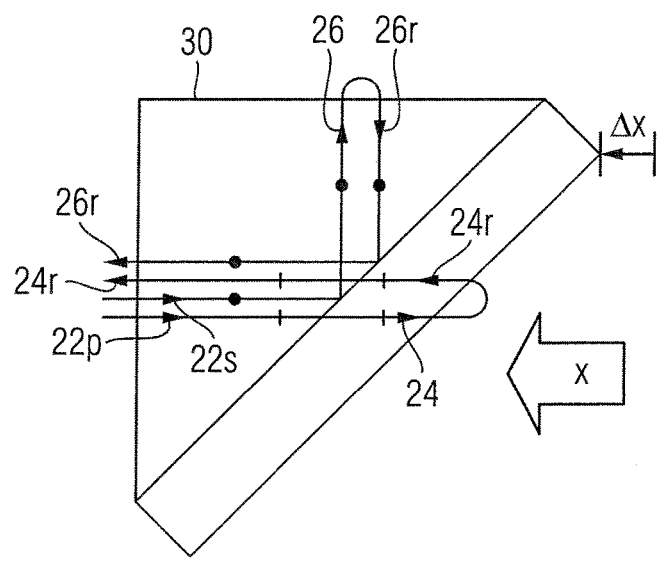

FIG. 4 shows the irradiation module 30 in a position displaced to the right, i.e., in the x direction, with respect to the position according to FIG. 2, and so parallel to the irradiating direction of the measuring beam 22. The y position of the irradiation module 30 is unchanged with respect to the position in FIG. 2. As is evident from the beam path in FIG. 4, the path length changes neither for the first partial beam 24 or 24r nor for the second partial beam 26 or 26r. Therefore, a displacement of the irradiation module 30 in the x direction does not make itself noticeable in the detection signal of the detector 18.

Figure 5:
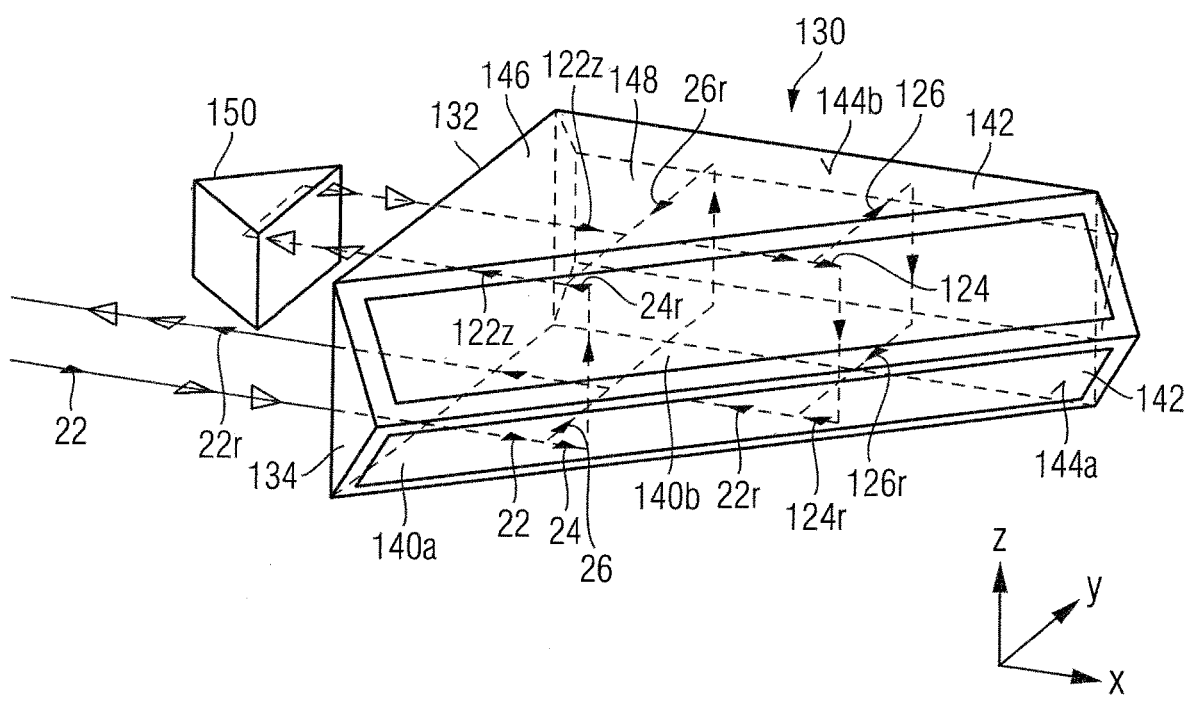
Figure 6:
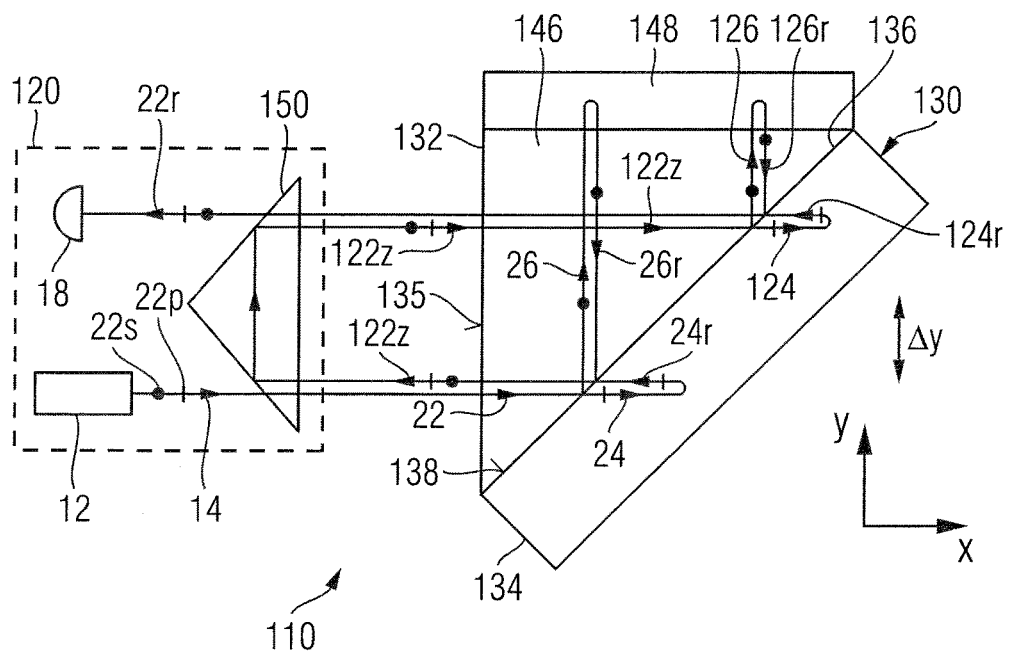

FIG. 5 shows a further embodiment 130 according to the invention of an irradiation module for a measuring apparatus 110, shown in a top view in FIG. 6, for measuring a position change. The measuring apparatus 110 comprises a measuring head 120 and the irradiation module 130. A back-reflection element 150 in the form of a deflection prism is assigned to the irradiation module 130. The back-reflection element 150 is part of the measuring head 120. For the measuring apparatus 110 according to FIG. 6 the measuring head 120 performs the same function as the measuring head 20 for the measuring apparatus 10 according to FIG. 1.

For this purpose the measuring head 120 also comprises a beam generation device 12 for generating measuring light 14 and a detector 18. As illustrated in FIG. 5 and FIG. 6, the irradiation module 130 has a first partial body 132 and a second partial body 134. The first partial body 132 comprises a base body 146 which, like the first partial body 32 according to FIG. 1, is configured as a prism with a base surface in the form of a right-angled triangle. A first cathetus-side face of the triangular prism serves as an irradiation surface 135 while a reflection part 148 in the form of a trapezoidal body adjoins the second cathetus-side face. The reflection part 148 can be formed in one part with the base body 146 or be fastened as a separate body to the base body 146.

Similar to the irradiation module 30 according to FIG. 1, the second partial body 134 adjoins the hypotenuse-side lateral face of the base body 146 of FIG. 6, a beam-splitting layer 136 being arranged between the first partial body 132 and the second partial body 134. The second partial body 134 is in the form of a prism with a base surface in the form of a right-angled triangle the hypotenuse-side face of which adjoins the hypotenuse-side face of the base body 146 of the first partial body 132. Here the triangular base surface of the prism forming the second partial body is rotated by 90° with respect to the triangular base surface of the prism forming the base body 146 of the first partial body 132.

Optical diffraction gratings 140a and 140b are arranged on the two cathetus-side lateral faces of the triangular prism forming the second partial body. Therefore, the optical diffraction gratings 140a and 140b are tilted towards one another, in the present case the tilt angle being 90°. During measuring operation the measuring beam 22 generated by the measuring head 120 on the irradiation surface 135 passes into the first partial body 132 which is produced from a material, in particular glass, which is transparent for the measuring light 14 and then strikes the beam-splitting layer 136 serving as a beam-splitting surface 138.

As in the irradiation module 30 according to FIG. 1, a portion of the measuring beam 22 in the form of a first partial beam 24, polarised parallel to the plane of the drawing, passes through the beam-splitting layer 136. The first partial beam 24 then strikes the first optical diffraction grating 140a. The first optical diffraction grating 140a is configured such that the first partial beam 24 is deflected upwards, i.e., in the z direction so that it strikes the second optical diffraction grating 140b. On the second optical diffraction grating 140b the first partial beam is deflected once again such that the resulting partial beam 24r has an orientation opposite to the incoming measuring beam 22 but runs offset with respect to this in the z direction.

The portion of the incoming measuring beam 22 reflected on the beam-splitting layer 136 contains light polarized perpendicular to the plane of the drawing and as a second partial beam 26 runs perpendicular to the irradiating direction of the measuring radiation onto the reflection part 148. The reflection part 148 is in the form of a prism, the base surface of which is formed by an equal-sided trapezium. The arm-side lateral faces of this prism are respectively formed as reflection surfaces 144a and 144b by coating with a reflection coating 142. First of all, the second partial beam 26 strikes the first reflection surface 144a, is deflected by the latter perpendicularly upwards, i.e., in the z direction, and is then reflected back by the second reflection surface 144b in the form of a reflected second partial beam 26r onto the beam-splitting surface 138.

The reflected second partial beam 26r is then reflected on the beam-splitting layer 136 and forms together with the first partial beam 24r which has been thrown back a measuring beam identified by reference number 122z in the intermediate state. The measuring beam 122z runs in the opposite direction to the incoming measuring beam 22, but is offset with respect to the latter in the z direction. The back-reflection element 150 of the measuring head 120 already mentioned is arranged such that the beam direction of the measuring beam 122z is reversed and, offset in the y direction, passes once again into the first partial body 132 on the irradiation surface 135. Due to the offset in the y direction, in comparison to the measuring beam 22 the measuring beam 122z only strikes the beam-splitting layer 136 at a point lying further to the back. Beam splitting takes place here once again into a first partial beam 124 and a second partial beam 126. The first partial beam 124 is formed by the portion passing through the beam-splitting layer 136, is polarised parallel to the plane of the drawing and is reflected on the optical diffraction gratings 140b and 140a.

The beam 124r resulting from the reflection on the two diffraction gratings 140a, 140b is offset downwards in the z direction with respect to the measuring beam 122z and has an opposite beam direction. The second partial beam 126 is reflected on the reflection surfaces 144b and 144a and as the reflected second partial beam 126r strikes the beam-splitting layer 136 again on which the latter is then reflected once again. After the reflection the partial beam 126r together with the first partial beam 124r forms a measuring beam 22r passing back. The measuring beam 22r passing back has an orientation opposite to the incoming measuring beam 22 and is offset to the latter in the y direction.

After the measuring beam 22r passing back passes into the measuring head an intensity measurement is taken in the detector 18 similarly to the embodiment according to FIG. 1. As already explained with regard to the embodiment in FIGS. 2 to 4, an evaluation of the measuring signal makes it possible to determine a position change of the irradiation module 130 in the y direction, i.e., in a direction transverse to the irradiating direction of the measuring beam 22.

Figure 7:
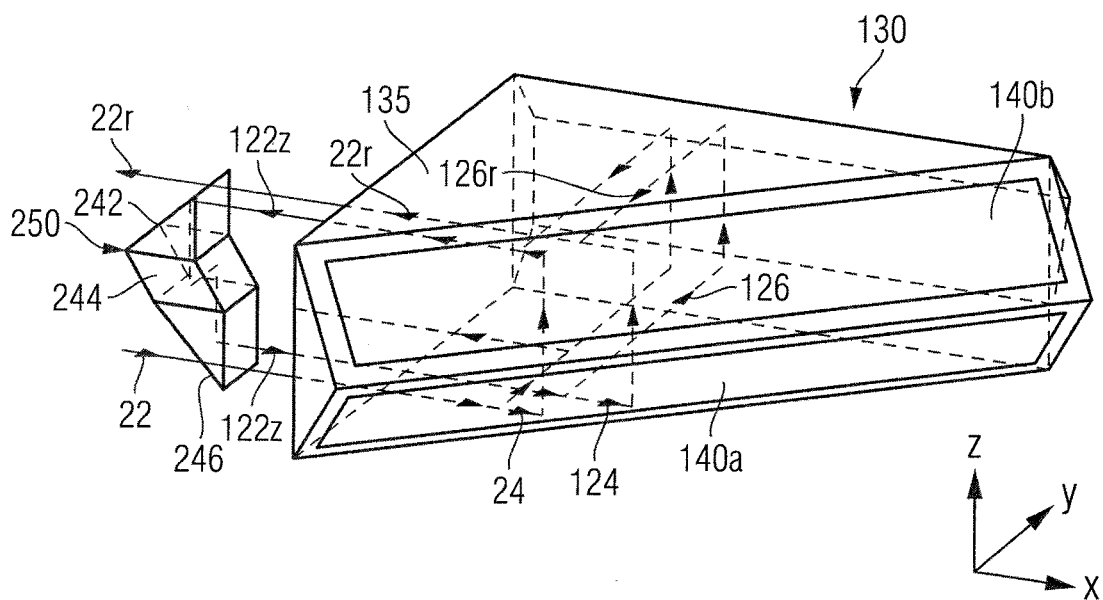
Figure 8:
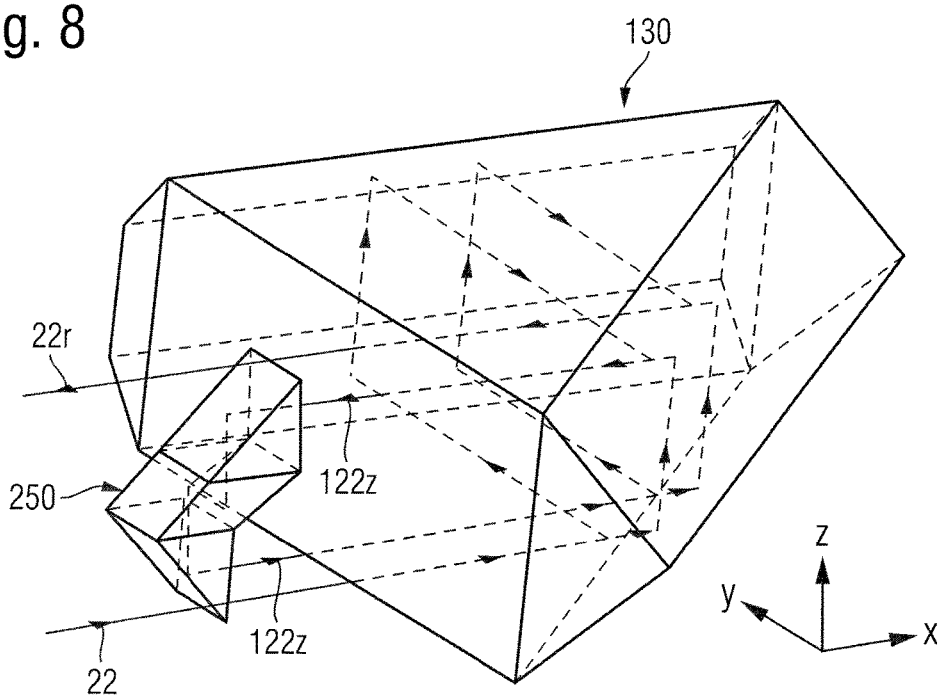

FIGS. 7 and 8 show the irradiation module 130 from FIGS. 5 and 6 in different viewing directions together with a further embodiment 250 of the back-reflection element. The back-reflection element 250 is configured to reflect the measuring beam 122z back onto the irradiation module 130 such that the latter undergoes displacement in the z direction as well as displacement in the y direction. For this purpose the back-reflection element 250 has two deflection prisms 242 and 246 between which a beam displacement prism 244 in the form of an oblique prism is arranged with a rectangular base surface. As evident from the measuring beam path shown in FIGS. 7 and 8, when using the back-reflection element 250 the respectively first partial beams 24 and 124 strike the respective optical diffraction gratings 140a and 140b, respectively at the same angle, as the measuring radiation passes through the irradiation module 130 for the first and the second time. It is therefore possible to optimise the degree of reflection of the diffraction gratings 140a and 140b to a single direction of incidence, namely the direction of incidence of the beams 24 and 124. By means of this optimisation a degree of reflection of, for example, 80% can be achieved. Diffraction gratings optimised to a direction of incidence are known as Blaze gratings or Echelle gratings. By means of this optimisation these gratings only have a high degree of reflection in one direction of incidence and wavelength.

Figure 9:
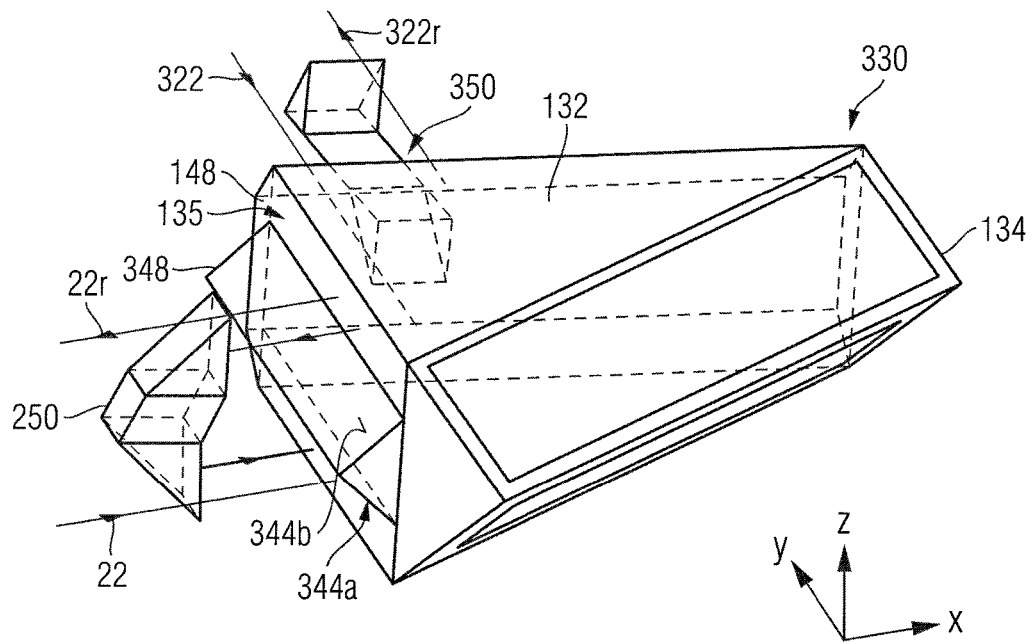

FIG. 9 shows a further embodiment 330 of an irradiation module according to the invention. This embodiment is configured to measure a position change of the irradiation module 330 in two spatial directions, both in the x and in the y direction according to the coordinate system from FIG. 9. For this purpose the irradiation module 330 is configured to reflect back, in addition to the back-reflection of the measuring beam 22 incoming in the x direction, a further measuring beam 322 which is incoming in the y direction. For this purpose, with respect to the irradiation module 130 according to FIG. 7, the irradiation module 330 has a further reflection part 348 in the form of a prism with a base surface in the form of a rectangular triangle. The reflection part 348 is arranged on the irradiation surface 135 of the irradiation module 130.

The cathetus-side lateral faces of the reflection part 348 form reflection surfaces 344a and 344b for reflecting back corresponding partial beams of the measuring beam 322 in the irradiation module 330. The irradiation module 330 is operated with two measuring heads which are respectively formed similarly to the measuring head 120 shown in FIG. 6. A first measuring head comprises a back-reflection element 250 which corresponds to the back-reflection element from FIG. 7 and is aligned in the x direction in relation to the radiating and recording direction. The second measuring head comprises a back-reflection element 350 similar to the element 250 and is aligned in the y direction. This means that the second measuring head radiates the measuring beam 322 in the y direction and is configured to detect a measuring beam 322r passing back in the opposite direction.

Figure 10:
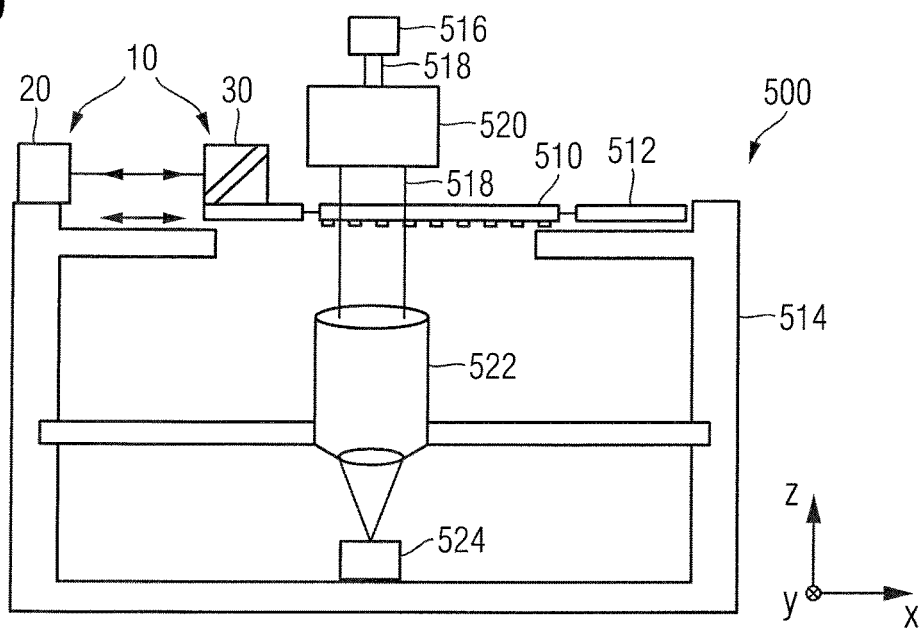
Figure 11:
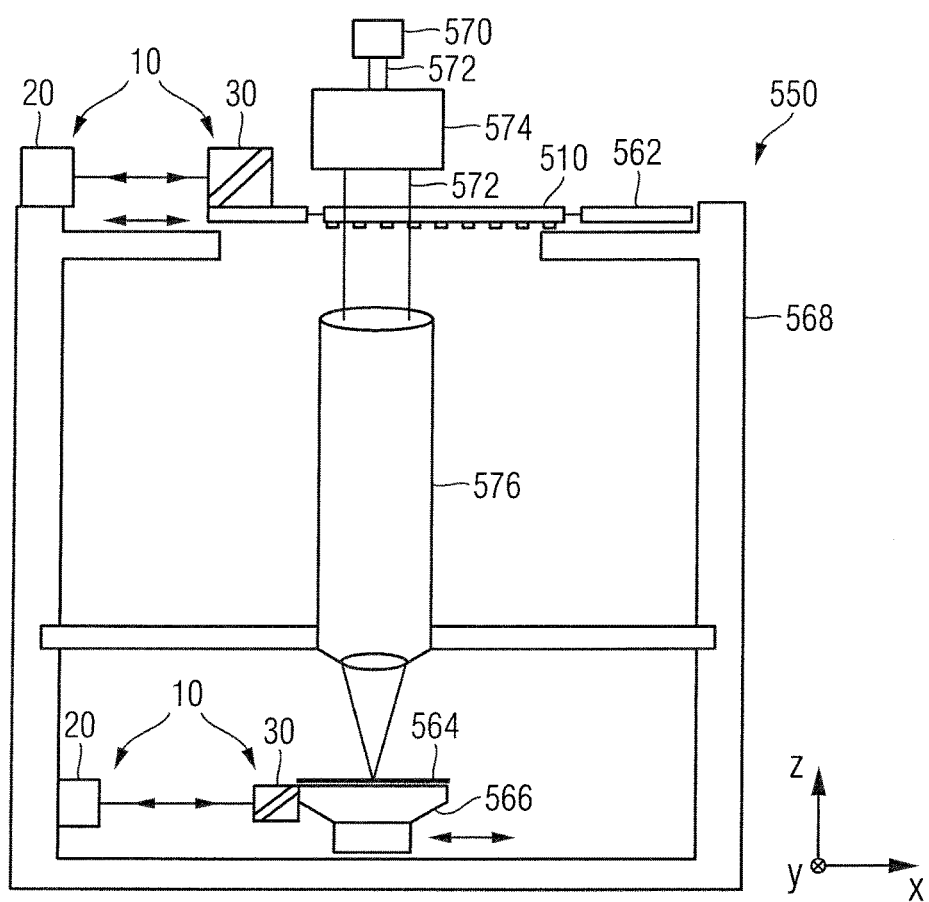

FIGS. 10 and 11 show possible uses of the measuring apparatus 10 according to the invention in microlithography, once in a mask inspection tool 500 for the inspection of a lithography mask 510 and furthermore in a projection exposure tool 550 for microlithography. The measuring apparatuses 10 comprising the measuring heads 20 and the irradiation modules 30 drawn in in FIGS. 10 and 11 only serve as an exemplary illustration. As is quite evident to the person skilled in the art, all of the embodiments of the measuring heads and irradiation modules shown in FIGS. 1 to 9 can be used in the mask inspection tool 500 and the projection exposure tool 550. The measuring apparatus according to the invention 10 can also be used in a position determining tool in the form of a so-called "registration measuring device." This type of position determining device determines the exact positioning of lithography structures on the lithography mask 510 in relation to target positionings. The basic structure of this type of position determining tool corresponds to the structure of the mask inspection tool 500 shown in FIG. 10.

As already mentioned above, FIG. 10 shows a mask inspection tool 500 for the inspection of a lithography mask 510. This type of mask inspection tool 500 serves to measure the aerial image of the lithography mask 510 outside of a projection exposure tool in order to identify write errors of the mask. The mask inspection tool 510 comprises an inspection light source 516 for generating inspection radiation 518. The wavelength of the inspection radiation 518 corresponds to the wavelength for which the lithography mask 510 for use in a protection exposure tool is configured. The wavelength of the inspection radiation 518 can thus come within the DUV wavelength range, e.g., it can be 248 nm or 193 nm, or also come within the EUV wavelength range. The inspection radiation 518 is irradiated onto the lithography mask 510 by means of an illumination system 520. The lithography mask 510 is then imaged onto a detector 524 by means of imaging optics 522. Here the lithography mask 510 is held by a mask holder in the form of a mask table 512.

During the inspection the mask table 512 is displaced step by step transversely to the optical axis of the imaging optics 522 with respect to a frame 514 of the mask inspection tool 500. The measuring apparatus 10 is used for the accurate measurement of the chronological progression of the position of the mask table 512 with respect to the frame 514. Its measuring head 20 is fastened to the frame 514 while the irradiation module 30 is arranged on the mask table 512. The edge length of the hypotenuse-side surface of the first partial body 32 of the irradiation module 30 is adapted to the displacement range of the mask table 512 and has for example a length of 15 cm.

As also already mentioned above, FIG. 11 shows a projection exposure tool 550 for microlithography. This serves to image mask structures of a lithography mask 510 onto a substrate 564 in the form of a wafer. For this purpose the projection exposure tool 550 comprises an exposure radiation source 570 for generating exposure radiation 572, for example in the DUV or in the EUV wavelength range. The imaging onto the substrate 564 takes place by means of a projection objective 576. During an imaging process the lithography mask 510 is displaced by means of a holding apparatus in the form of a mask table 562 and the substrate 564 is displaced by means of a further holding apparatus in the form of a substrate table 566 towards one another in the opposite direction and respectively transversely to the optical axis of the projection objective 576. The precise movement of the mask table 562 and of the substrate table 566 is monitored with a respective measuring apparatus 10. For this purpose an irradiation module 30 is respectively arranged on the mask table 562 and on the substrate table 566. The irradiation modules 30 are irradiated by a respective measuring head 20 disposed on the frame 568 of the projection exposure tool 550.

What is claimed is:

1. An irradiation module for a measuring apparatus, the irradiation module being light-conductive, being configured as a cohesive body and comprising:
    a beam-splitting surface arranged within the irradiation module for splitting an incoming measuring beam into two partial beams;
    an optical diffraction grating for interaction with a first of the two partial beams; and
    a reflection surface for reflecting the second partial beam;
    wherein the irradiation module has a closed surface such that respective beam paths of the partial beams are totally enclosed by the surface of the irradiation module up to where the partial beams are brought together again in the irradiation module, and the irradiation module is configured to cause the first partial beam to be reflected by the optical diffraction grating at least twice, and to cause the second partial beam to be reflected by the reflection surface at least twice before the first and second partial beams are brought together again.

2. The irradiation module according to claim 1, which further comprises an irradiation surface for irradiation of the measuring beam, the irradiation module being configured such that:
    upon irradiating the measuring beam at a respectively appropriate angle of incidence onto the irradiation surface, the first partial beam after interaction with the optical diffraction grating and the second partial beam after reflection at the reflection surface are superimposed with one another independently of the position of the measuring beam on the irradiation surface,
    the optical path length of the first partial beam between the beam-splitting surface and the diffraction grating is independent of the position of the measuring beam on the irradiation surface,
    the optical path length of the second partial beam between the beam-splitting surface and the reflection surface is dependent upon the position of the measuring beam on the irradiation surface, and
    the superimposed partial beams have a phase difference that is dependent upon the position of the measuring beam on the irradiation surface.

3. The irradiation module according to claim 1, which is configured as a solid body such that respective beam paths of the partial beams run continuously within solid material up to where the partial beams are brought together again in the irradiation module.

4. The irradiation module according to claim 1, which comprises two partial bodies which are connected to one another along the beam-splitting surface.

5. The irradiation module according to claim 4, wherein one of the two partial bodies has a form tapering in a longitudinal direction of the beam-splitting surface.

6. The irradiation module according to claim 1, which is configured as a retroreflector such that measuring light irradiated onto the irradiation module in an irradiating direction after interaction with the irradiation module is radiated in a radiating direction opposite to the irradiating direction independently of the precise alignment of the irradiation module.

7. The irradiation module according to claim 1, wherein the optical diffraction grating is configured to reflect the first partial beam in a direction that deviates from a direction specified by the law of reflection.

8. The irradiation module according to claim 1, which has two diffraction gratings tilted towards one another.

9. The irradiation module according to claim 1, which has two reflection surfaces tilted towards one another.

10. The irradiation module according to claim 1, which has two pairs on reflection surfaces respectively tilted towards one another.

11. A measuring apparatus comprising an irradiation module according to claim 1, which is configured to measure a position change of a measuring object in at least one spatial direction in relation to a reference object and furthermore has a beam generation device for generating the measuring beam, the beam generation device being arranged moveably in relation to the irradiation module.

12. The measuring apparatus according to claim 11, in which the beam generation device is configured to irradiate two measuring beams in different directions onto the irradiation module, and the irradiation module is configured to reflect back the measuring beams such that by measuring the reflected back measuring beams a position change of the irradiation module can be determined in two spatial directions.

13. The measuring apparatus according to claim 11, which further comprises a back-reflection element which is configured to reflect a beam passing out of the irradiation module back onto the irradiation module such that the reflected back beam is offset with respect to the beam passing out of the irradiation module transversely to the beam direction.

14. The measuring apparatus according to claim 11, wherein the irradiation module is configured to bring the partial beams back together again after interaction with the optical diffraction grating or the reflection surface such that the beam brought together is offset in a first direction with respect to the measuring beam and the measuring apparatus further comprises a back-reflection element which is configured to offset the beam brought together by back reflection in a direction which has at least one component orthogonal to the first direction.

15. The measuring apparatus according to claim 14, wherein the back-reflection element is configured to further offset the brought together beam by the back reflection parallel to the first direction.

16. A mask inspection tool for inspecting a lithography mask comprising a measuring apparatus according to claim 11.

17. The mask inspection tool according to claim 16, which comprises a mask holder that is mounted moveably with respect to a reference frame, and wherein the measuring apparatus is configured to measure a position change of the mask holder in relation to the reference frame.

18. A position determining tool for determining a positioning of structures on a lithography mask comprising a measuring apparatus according to claim 11.

19. A projection exposure tool for microlithography comprising a measuring apparatus according to claim 11.

20. The projection exposure tool according to claim 19, which has a first holding apparatus for holding a lithography mask and a second holding apparatus for holding a substrate to be structured, wherein the holding apparatuses are respectively mounted moveably with respect to a reference frame, and the measuring apparatus is configured to measure a position change of one of the two holding apparatuses in relation to the reference frame.

21. An irradiation module for a measuring apparatus, the irradiation module being light-conductive, being configured as a cohesive body and comprising:
  a beam-splitting surface arranged within the irradiation module for splitting an incoming measuring beam into two partial beams;
  an optical diffraction grating for interaction with a first of the two partial beams;
  a reflection surface for reflecting the second partial beam; and
  an irradiation surface for irradiation of the measuring beam, the irradiation module being configured such that:
  upon irradiating the measuring beam at a respectively appropriate angle of incidence onto the irradiation surface, the first partial beam after interaction with the optical diffraction grating and the second partial beam after reflection at the reflection surface are superimposed with one another independently of the position of the measuring beam on the irradiation surface,
  the optical path length of the first partial beam between the beam-splitting surface and the diffraction grating is independent of the position of the measuring beam on the irradiation surface;
  the optical path length of the second partial beam between the beam-splitting surface and the reflection surface is dependent upon the position of the measuring beam on the irradiation surface, and
  the superimposed partial beams have a phase difference that is dependent upon the position of the measuring beam on the irradiation surface.

22. An irradiation module for a measuring apparatus, the irradiation module being light-conductive, being configured as a cohesive body and comprising:
  a beam-splitting surface arranged within the irradiation module for splitting an incoming measuring beam into two partial beams;
  an optical diffraction grating for interaction with a first of the two partial beams;
  a reflection surface for reflecting the second partial beam; and
  an irradiation surface for irradiation of the measuring beam,
  the irradiation module being configured such that the optical path length of the first partial beam between the beam-splitting surface and the diffraction grating is independent of the position of the measuring beam on the irradiation surface.

23. The irradiation module of claim 22, which is configured as a solid body such that respective beam paths of the partial beams run continuously within solid material up to where the partial beams are brought together again in the irradiation module.

24. The irradiation module of claim 22, which comprises two partial bodies which are connected to one another along the beam-splitting surface.

25. The irradiation module of claim 24 in which one of the two partial bodies has a form tapering in a longitudinal direction of the beam-splitting surface.

26. The irradiation module of claim 22, which is configured as a retroreflector such that measuring light irradiated onto the irradiation module in an irradiating direction after interaction with the irradiation module is radiated in a radiating direction opposite to the irradiating direction independently of the precise alignment of the irradiation module.

27. The irradiation module of claim 22 in which the optical diffraction grating is configured to reflect the first partial beam in a direction that deviates from a direction specified by the law of reflection.

28. The irradiation module of claim 22, which has two diffraction gratings tilted towards one another.

29. The irradiation module of claim 22, which has two reflection surfaces tilted towards one another.

30. The irradiation module of claim 22, which has two pairs of reflection surfaces respectively tilted towards one another.

31. A measuring apparatus comprising an irradiation module according to claim 22, which is configured to measure a position change of a measuring object in at least one spatial direction in relation to a reference object and furthermore has a beam generation device for generating the measuring beam, the beam generation device being arranged moveably in relation to the irradiation module.

32. The measuring apparatus of claim 31, in which the beam generation device is configured to irradiate two measuring beams in different directions onto the irradiation module, and the irradiation module is configured to reflect back the measuring beams such that by measuring the reflected back measuring beams a position change of the irradiation module can be determined in two spatial directions.

33. The measuring apparatus of claim 31, further comprising a back-reflection element that is configured to reflect a beam passing out of the irradiation module back onto the irradiation module such that the reflected back beam is offset with respect to the beam passing out of the irradiation module transversely to the beam direction.

34. The measuring apparatus of claim 31 in which the irradiation module is configured to bring the partial beams back together again after interaction with the optical diffraction grating or the reflection surface such that the beam brought together is offset in a first direction with respect to the measuring beam and the measuring apparatus further comprises a back-reflection element which is configured to offset the beam brought together by back reflection in a direction which has at least one component orthogonal to the first direction.

35. The measuring apparatus of claim 34 in which the back-reflection element is configured to further offset the brought together beam by the back reflection parallel to the first direction.

36. A mask inspection tool for inspecting a lithography mask comprising a measuring apparatus according to claim 31.

37. The mask inspection tool of claim 36, which comprises a mask holder that is mounted moveably with respect to a reference frame, and wherein the measuring apparatus is configured to measure a position change of the mask holder in relation to the reference frame.

38. A position determining tool for determining a positioning of structures on a lithography mask comprising a measuring apparatus according to claim 31.

39. A projection exposure tool for microlithography comprising a measuring apparatus according to claim 31.

40. The projection exposure tool according to claim 39, which has a first holding apparatus for holding a lithography mask and a second holding apparatus for holding a substrate to be structured, wherein the holding apparatuses are respectively mounted moveably with respect to a reference frame, and the measuring apparatus is configured to measure a position change of one of the two holding apparatuses in relation to the reference frame.

* * * * *